(12) United States Patent
Dankner

(10) Patent No.: US 7,877,217 B2
(45) Date of Patent: Jan. 25, 2011

(54) ELECTRIC ULTIMATE DEFECTS ANALYZER DETECTING ALL DEFECTS IN PCB/MCM

(75) Inventor: Yair Dankner, Kfar Saba (IL)

(73) Assignee: Invisible Ltd., Kfar Saba (IL)

( * ) Notice: Subject to any disclaimer, the term of this patent is extended or adjusted under 35 U.S.C. 154(b) by 58 days.

(21) Appl. No.: 12/332,879

(22) Filed: Dec. 11, 2008

(65) Prior Publication Data
US 2009/0150092 A1   Jun. 11, 2009

Related U.S. Application Data

(63) Continuation-in-part of application No. 10/595,166, filed as application No. PCT/IL2004/000842 on Sep. 14, 2004, now abandoned.

(60) Provisional application No. 60/502,941, filed on Sep. 16, 2003.

(51) Int. Cl.
G01R 31/00 (2006.01)
G06F 19/00 (2006.01)

(52) U.S. Cl. .............................. 702/35; 374/5; 702/117

(58) Field of Classification Search .................. 702/33, 702/35, 40, 49, 75, 76, 77, 85, 99, 117, 118, 702/134, 188, 189; 374/5; 324/753; 716/4
See application file for complete search history.

(56) References Cited

U.S. PATENT DOCUMENTS

| 5,608,526 A | 3/1997 | Piwonka-Corle et al. |
|---|---|---|
| 6,049,220 A | 4/2000 | Borden et al. |
| 6,430,728 B1 | 8/2002 | Goruganthu et al. |
| 6,512,385 B1 | 1/2003 | Pfaff et al. |
| 6,820,028 B2 | 11/2004 | Ye et al. |
| 6,840,667 B2 | 1/2005 | Schlagheck et al. |
| 6,971,791 B2 | 12/2005 | Borden et al. |
| 2002/0027941 A1 | 3/2002 | Schlagheck et al. |
| 2002/0167987 A1 | 11/2002 | Schlagheck et al. |
| 2004/0028113 A1 | 2/2004 | Schlagheck et al. |

FOREIGN PATENT DOCUMENTS

WO   WO0248720   6/2002

OTHER PUBLICATIONS

International Search Report published Jul. 28, 2005 for PCT/IL2004/000842 filed Sep. 14, 2004.
International Search Report on Patentability published Mar. 16, 2006 for PCT/IL2004/000842 filed Sep. 14, 2004.
Written Opinion of the International Searching Authority published Mar. 16, 2006 for PCT/IL2004/000842 filed Sep. 14, 2004.

*Primary Examiner*—John H Le
(74) *Attorney, Agent, or Firm*—Martin Fleit; Paul D. Bianco; Fleit Gibbons Gutman Bonigni & Bianco PL

(57) ABSTRACT

A method and a system of testing electronic components assemblies, each assembly comprising a multiplicity of tracks, each connecting a multiplicity of ports. The system may enable applying heat energy upon at least one part of the at least one track; measuring energy diffusion within a predefined time interval of the heated part of the track; calculating at least one distribution energy diffusion profile associated according to the measured diffusion, where the profile represents the diffusion of energy versus time; and identifying defects in the at least one track, according to the analysis of the diffusion profile.

22 Claims, 6 Drawing Sheets

ELECTRIC ULTIMATE DEFECTS ANALYZER DETECTING ALL DEFECTS IN PCB/MCM

CROSS REFERENCE OF THE APPLICATION

This application is a Continuation In Part of U.S. application Ser. No. 10/595,166 filed Mar. 15, 2006 now abandoned as a national phase of international application No. PCT/IL2004/000842 filed Sep. 14, 2004, which in turn claimed the benefit of U.S. provisional application No. 60/502,941 filed Sep. 16, 2003. All the aforementioned related applications are incorporated by reference herein in their entirety.

FIELD OF THE INVENTION

The present invention relates generally to the field of quality and performances testing systems and methods for electronic products and more particularly, to systems and methods for testing of quality and performances of electronic components assemblies comprising tracks and ports.

BACKGROUND OF THE INVENTION

At present, there are two major methods for testing the performances of Printed Circuit Boards (PCB) or Multi Chip Modules) MCM), either during or after the manufacturing process. One of those methods is commonly known in the art as 'the bed of nails method' and another is a method commonly known in the art as 'the flying probe method'.

The bed of nails is a resistance measurements method comprised of springy pins, which are electrically connected to ports on the PCB/MCM. During the test signals are applied to some of the nails, and measurements are taken at other nails. The bed of nails device needs to be especially designed, built and programmed to fit the structure of the tested PCB/MCM type. Each type of PCB/MCM requires a different device.

The flying probe method is based on moving pair(s)' probes physically from one point to another, touching the board and sequentially conducting the same tests made by the bed of nails. This method eliminates the need to build the physical element required by the bed of nails method, but it still requires making physical contact with the board while conducting electrical tests. Bed of nail tests is limited to a minimum pitch size of 600 micrometer. The method of testing PCBs by flying probe is limited to a minimum pitch size of 300 micrometers. The bed of nails test time can take between 1 and 2 minutes per PCB/MCM, for flying probes the test time is more than two hours.

SUMMARY

The present invention, according to some embodiments thereof, provides a method and a system of testing electronic components assemblies, each assembly comprising a multiplicity of tracks, each connecting a multiplicity of ports.

According to embodiments, the system may enable applying heat energy upon at least one part of the at least one track; measuring energy diffusion within a predefined time interval of the heated part of the track; calculating at least one distribution energy diffusion profile associated according to the measured diffusion, where the profile represents the diffusion of energy versus time; and identifying defects in the at least one track, according to the analysis of the diffusion profile.

According to embodiments, the system may comprise at least one heating source, enabling to heat at least one part of at least one of the tracks of the electronic components assembly that is under test; at least one measuring device, enabling to measure the energy diffusion in at least one part of the at least one track within a predefined time interval; and at least one processing unit, enabling to control the heating and measuring devices, retrieve data from the measuring and heating devices and analyze the data. The analysis may enable identifying defects in tracks that are tested by analyzing at least one energy diffusion profile of the track that is tested, which represents the diffusion of energy versus time.

According to other embodiments, the method and system may enable measuring phonon frequency at each port of at least one of the assembly's tracks; and identifying defects in the at least one track, by comparing the phonon frequency emitted from one port of the track to phonon frequency emitted from at least one other port of the same track.

BRIEF DESCRIPTION OF THE DRAWINGS

The subject matter regarded as the invention will become more clearly understood in light of the ensuing description of embodiments herein, given by way of example and for purposes of illustrative discussion of the present invention only, with reference to the accompanying drawings, wherein FIG. 1A schematically illustrates a Printed Circuit Board (PCB), having two electric tracks.

Figure 1A:
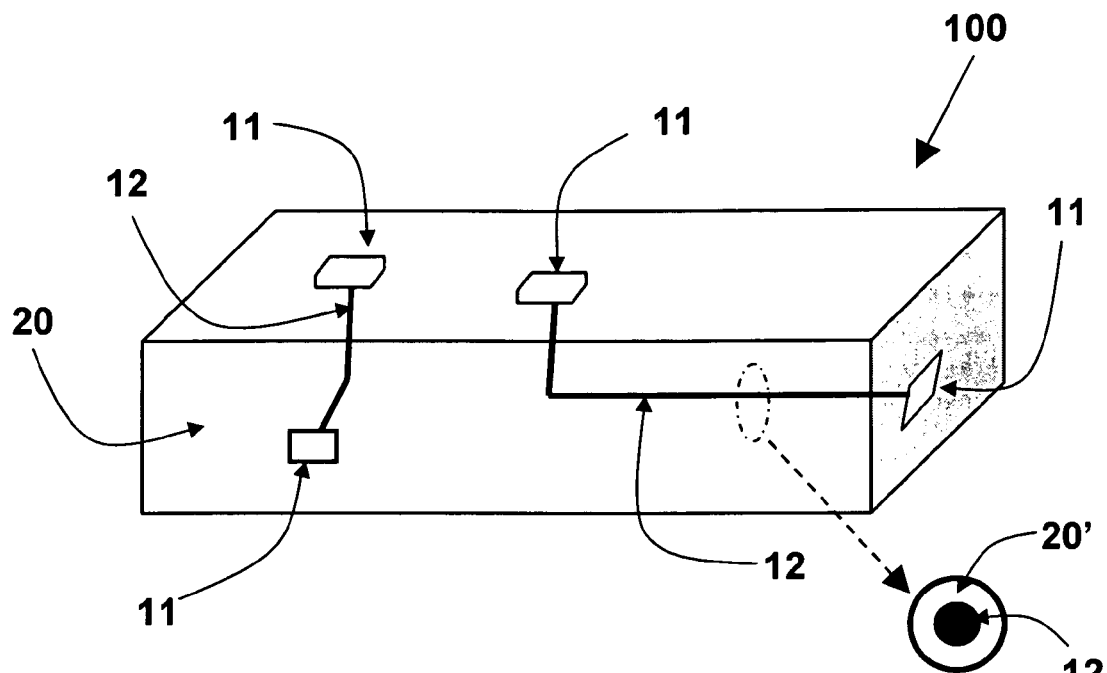
FIG. 1B schematically illustrates a Printed Circuit Board (PCB), having two electric tracks, where the PCB has a defect.

The drawings together with the description make apparent to those skilled in the art how the invention may be embodied in practice.

DETAILED DESCRIPTION OF SOME EMBODIMENTS OF THE INVENTION

The present invention, according to some embodiments thereof, provides a system 1000 and a method enabling to test the performance and quality of electronic components assemblies 100 comprising multiple integrated circuits such as printed circuit boards (PCBs) or Multi Chip Modules (MCMs) (which may also be referred to in this document as "Device Under Test" (DUT) 100). Each electronic components assembly 100 may comprise circuits that have electric tracks 12, each track 12 connects to least two ports 11 connected to each end of each track 12, where the ports 11 may be electric pads and the tracks 12 may be pathways conducting electric current between the ports 11.

Electronic components assemblies 100 such as PCBs and MCMs may be three-dimensional (3D) structures that may have tracks 12 that connect ports 11 that are situated in various locations on the exposed surface(s) of the PCB 100. The track 12 may be a thin strap of conductive material (e.g. copper) laminated by an electrically non-conductive lamination material creating a lamina coating 20 layer coating the track 12, where the ports 11 may also be made from conductive materials connected to the ends of the track 12, serving as electric contacts that are usually exposed and are not laminated. A track 12 may split into a multiplicity of channels ending at a multiplicity of output ports 11.

FIG. 1A schematically illustrates a 3D PCB electronic components assembly 100 having two tracks 12 each having two pad ports 11 connecting an electric track 12. In this example, each port 11 of each track 12 is situated at a different external wall of the electronic components assembly 100.

Figure 1B:
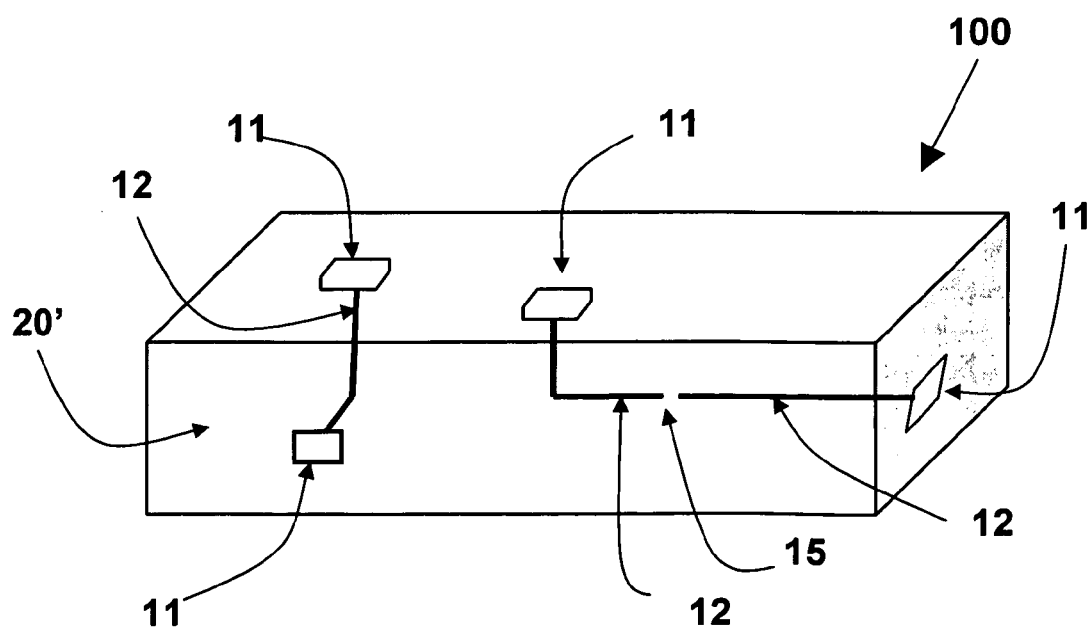

According to some embodiments of the invention, as illustrated in FIG. 1A and FIG. 1B, the material surrounding each track 12 may be made from electrically isolating material(s) such as Lamina, which may also be a heat isolating material, to allow electrically isolating each track 12, preventing or reducing electric leaks. As illustrated in FIG. 1B, each track 12 made from electrically (and thermally) conductive materials may be laminated by isolating lamination materials 20', which surround the entire track 12, where the tracks 12 of the assembly 100 are all surrounded by the isolating lamination material 20' and adhere to the assembly 100 thereby.

FIG. 1B schematically illustrates a PCB electronic components assembly 100 having two ports 11 connecting a track 12. As illustrated in FIG. 1B, one or more of the tracks 12 may have a defect 15 such as, for example, one or more gaps 15 situated at one position along the defected track 12, where isolating materials 20 (e.g. the Lamina or air) separates one broken edge of the track 12 from another.

Depending on the isolating material 20 in the gap, gap size, electric current and thickness of the track 12, the isolating lamination material 20' may completely prevent the electric current from passing through the track 12, once the gap size passes a threshold size (e.g. a threshold distance). On the other hand, the isolating lamination material 20' may still allow energy (heat) diffusion from one of the track's 12 broken ends to the other through the gap defect 15 enabling to still measure energy diffusion from one input port 11 to all output ports 11 of the track 12 and/or along the entire route of the track 12 within a predefined heating/cooling time interval.

The isolating lamination material 20' usually has a much higher heat resistance than that of the track 12 (since most electrically conductive materials are also heat conductive such as copper and have a much higher heat conductivity that that of the isolating material 20). A tester using suitable thermal measurement devices 300 may be able to detect substantial differences between energy (heat) diffusion of a non-defected track 12 and a defected one, having one or more gaps 15, since the heat diffusion between the ports 11 may be substantially different due to the differences in heat conductivity of the track 12 to that of the isolating lamination material 20'.

The thermal measuring of the energy (heat) diffusion (energy representing parameter such as Temperature versus time, for example) of tracks 12 of a PCB electronic components assemblies 100 may be carried out in various ways, depending upon the way the tracks 12, ports 11 and/or components of the assembly 100 are heated and the testing technique for measuring the diffusion, which may be predefined in the system 1000.

There may be various ways to measure and calculate energy (heat) diffusion that can be used to test the quality and performances of electric tracks 12 of an electric components assembly 100 when searching for defects (gaps 15) in the tracks 12, depending on the heating technique, the measuring location(s) and techniques and the defect types.

All theoretical calculations of the heat diffusion (which may be referred to hereinafter as "diffusion profiles") may be behaviors derived from the basic diffusion equation derived mainly from the law of energy conservation:

Consider a thin, rigid, heat-conducting body (a bar) of length "L".

Let $\theta(x, t)$ indicate the temperature of this bar at position "x" and time "t", where $0 \leq x \leq L$ and $t \geq 0$.

In other words, we postulate that the temperature T of the bar does not vary with the thickness. We assume that at each point of the bar the energy density per unit volume is proportional to the temperature T.

We assume that the surface of the bar is perfectly heat-insulated so no heat can be gained or lost through it, except of the input and output ports 11.

Therefore, the rate of change of energy in any finite part of the bar is equal to the total amount of heat diffused into this part of the bar.

This equation is known as the "heat equation", and it describes the evolution of temperature within a finite, one-dimensional, homogeneous continuum, with no internal sources of heat, subject to some initial and boundary conditions:

$$\frac{\partial \theta}{\partial t} = \gamma \frac{\partial^2 \theta}{\partial x^2}, 0 < x < l,$$

Where:

$$\gamma = \frac{\kappa}{c}.$$

Where:

$\gamma$ is known as the diffusion coefficient, Heat capacity $c(x)$ and the thermal conductivity $\chi(x)$ are point independent.

For the purpose of illustrating of the simulated diffusion profiles that may appear in the following graphs and diagrams, we assume that the PCB/MCM PCBs 100 conductors are finite, one-dimensional, homogeneous continuum and perfectly insulated bars but we can change this assumption, considering that the track 12 is not perfectly insulated, by changing the "Heat Equation" respectively.

Solving the heat equation for a PCB assembly's 100 conducting track 12, we may conclude that the rate at which heat flows through the track at position x and time t, depend on the quality and characteristic of the track 12. Damage or a defect (such as a gap 15) along the track will cause a change in the density of the material and in the diffusion coefficient, leading to a change in the rate of the heat flow. Therefore, any physical change in the track 12 will lead to a change in the heat diffusion between both end ports 11 of the track 12.

Heat is another form of energy. When an object is being heated its particles move faster and the molecules are vibrating at a range of frequencies (energy spectrum), depending on the substance and the shape of the object. This frequency can also be measured (instead or additionally to temperature) to identify changes in the ports' 11 diffusion profiles.

Figure 2:
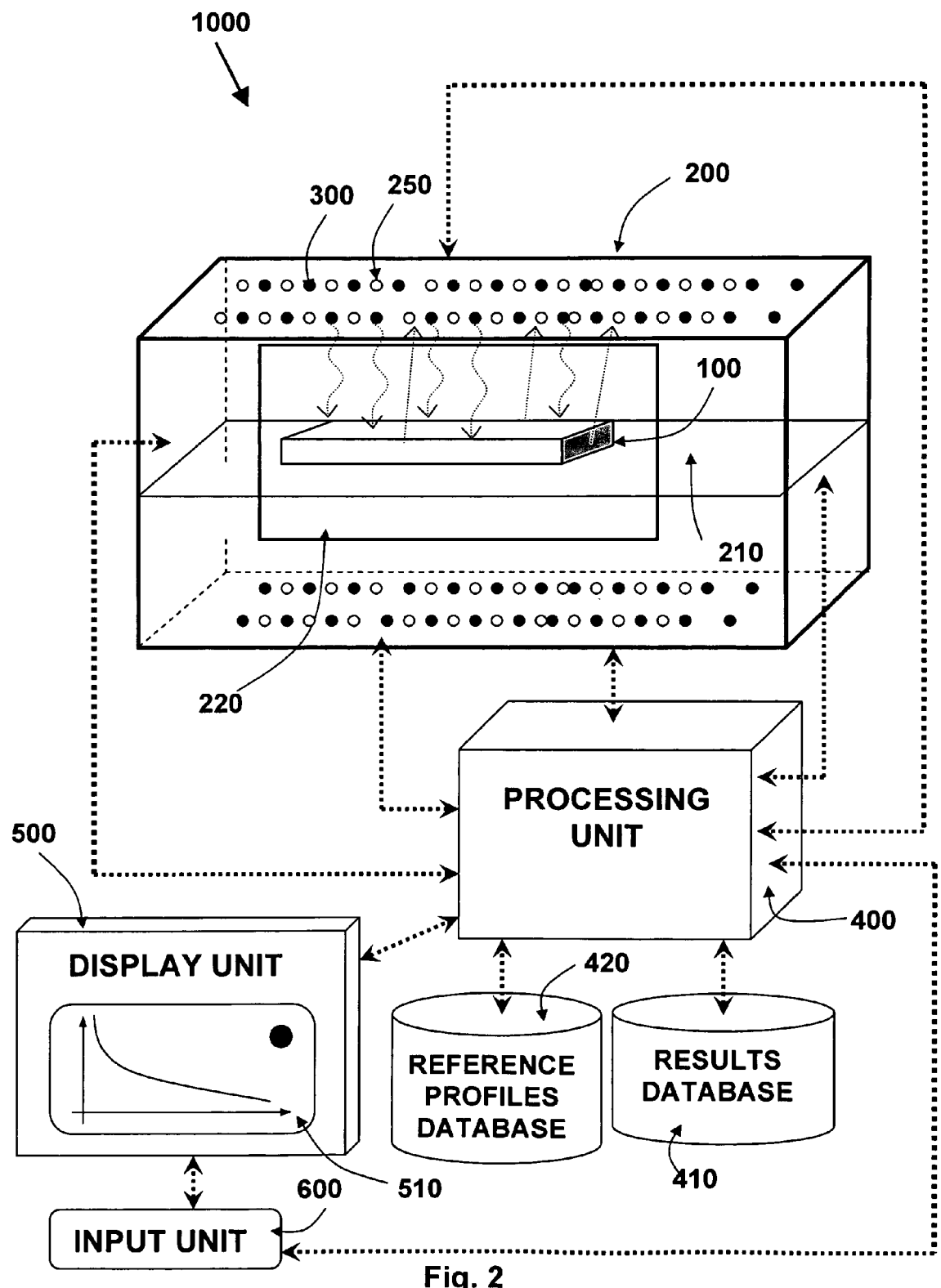
FIG. 2 is a block diagram, schematically illustrating a system for testing performances and quality of PCBs, according to some embodiments of the invention.

FIG. 2 schematically illustrates a testing system 1000, for testing the quality and/or performances of at least one track 12 and ports 11 in at least one electronic components assembly 100 such as a PCB or an MCM 100, according to some embodiments of the invention.

According to these embodiments, as illustrated in FIG. 2, the system 1000 may comprise: a heating device 200; at least one measuring device 300; at least one processing unit 400; at least one display unit 500; at least one results database 410; and at least one reference profiles database 420.

According to some embodiments of the invention, as illustrated in FIG. 2, a multiplicity of heating devices 200 may enable heating specific areas of the heating devices and controlling the temperature in these areas, which are heated therein as well as the heating temperature.

According to embodiments, the heating device 200 may comprise a multiplicity of heating sources 250, each heating source 250 may be any device known in the art that enables heating at least part of the electronic components assembly 100 to predefined temperature ranges (e.g. 60-180° C.) at predefined locations. The heating device 200 may be, for example, an oven enabling both controlling the temperatures, the heating areas therein as well as enable homogeneous heating of a predefined or selected area therein. The heating source 250 may be, for example, a laser light source that enables heating the ports 11 of each track 12 of the electronic components assembly 100 controlling the heating energy by controlling the frequency of the light emitted thereby (within a predefined frequency band).

According to some embodiments of the invention, the heating device 200 and heating sources 250 may be directed at heating ports 11 and/or areas of the electronic components assembly 100.

According to some embodiments of the invention, the heating device 200 may comprise at least one placement 210 upon which one or more PCBs or any other electronic components assembly 100 can be placed for the testing.

The heating device 200 and/or at least some of its heating sources 250 may further be operatively associated with the measurement devices 300, which, for instance, may be attached at the inner wall(s) of the oven 300.

According to some embodiments of the invention, the measuring devices 300 may enable measuring the temperature at predefined locations in the electronic components assembly 100. For example, the measuring devices 300 may be optical scanners (e.g. IR scanners or thermo couplers) enabling to swiftly scan the external surface of each or some of the electronic components assembly's 100 walls to get a thermal image of this surface at a resolution that allows distinguishing each port 11 and/or track 12 that emits heat to these scanned surfaces.

According to some embodiments of the invention, the processing unit 400 may enable retrieving measurements data from measuring devices 300 as well as control the heating device 200 (e.g. control the temperature of heating of the heating sources 250 and/or control the direction of heating light emission). The processing unit 400 may further allow processing the measurements data, analyzing the retrieved data by producing of a measured energy diffusion profile(s) (e.g. temperature versus time) of at least one of the electronic components assembly's 100 tracks 12 and ports 11, within a predefined time interval when the tracks, 12 or ports 11 of the electronic components assembly 100 is either cooling or heating, identifying defects and optionally the type of the identified defects and storing the resulting measured diffusion profiles in the results database 410.

According to some embodiments of the invention, the identification of defects may be carried out by comparing the measured energy diffusion profile of a track 12 to a corresponding known reference ideal or non-ideal non-defected track profile corresponding to the measured track 12 (e.g. according to the design plans of the PCB 100 under test) retrieved from the reference profiles database 420.

The reference diffusion profile of each track 12 tested, may be compatible with the design of the measured track 12 (known position, length number of ports 11 etc.) according to the test conditions (e.g. the temperature of heating, the time interval of cooling/heating, etc.).

According to some embodiments of the invention, the analysis may be carried out by image processing, in case the measuring devices 300 enable producing a thermal image of parts of the device.

According to other embodiments, the measuring of heat diffusion may be carried out optically by spectrometers as the measuring devices 300 enabling to measure heat diffusion profiles at the ports 11 of each track 12 of the assembly 100.

The analysis may include producing at least one diffusion profile of each track 12 by: (i) identifying the temperatures of all ports 11 in at least one predefined area on the electronic components assembly 100 at predefined moments in time within a predefined time-interval either while heating, after heating is done (when cooling) or both, while knowing in advance which port 11 that has been measured is connected to which port(s) 11 and the path of the track 12 between those ports 11 (e.g. by using the design plans of the PCB 100 under test) and calculating diffusion profiles of each port 11 of each track 12 (e.g. the curve representing the temperature versus time); or (ii) producing diffusion profile(s) of each measured track 12 and its ports 11 representing the temperature changes along the track 12 (e.g. the temperature versus the distance from a predefined point along the track 12).

According to some embodiments of the invention, the display unit 500 may enable presenting the analysis results, the measured and references results and the like. For that purpose, the display unit 500 may comprise display windows and may be operatively associated with the processing unit 400.

According to some embodiments of the invention, the input unit 600 may be operatively associated with the processing unit 400, which may be operatively associated with the heating device 200, the heating sources 250, the measuring devices 300 and the databases 410 and 420, to enable a tester (any person testing the electronic components assembly 100) to control the processing unit 400, and thereby the heating and measuring device 200 and 300 respectively.

Additionally, the processing unit 400 may be combined with the measuring devices 300 and/or the heating device 200 and at least one input unit 600 having an interface that allows the tester to control the heating, the measuring and the processing processes.

Since the electronic components assembly 100 may be three-dimensional, where the ports 11 and tracks 12 stretch along and connect to several sides or walls of the components assembly 12, the heating sources 250 may enable heating more than one surface of the components assembly 100 under test and the measuring devices 300 may allow taking measurements from various angles of the electronic components assembly 100.

Figure 3:
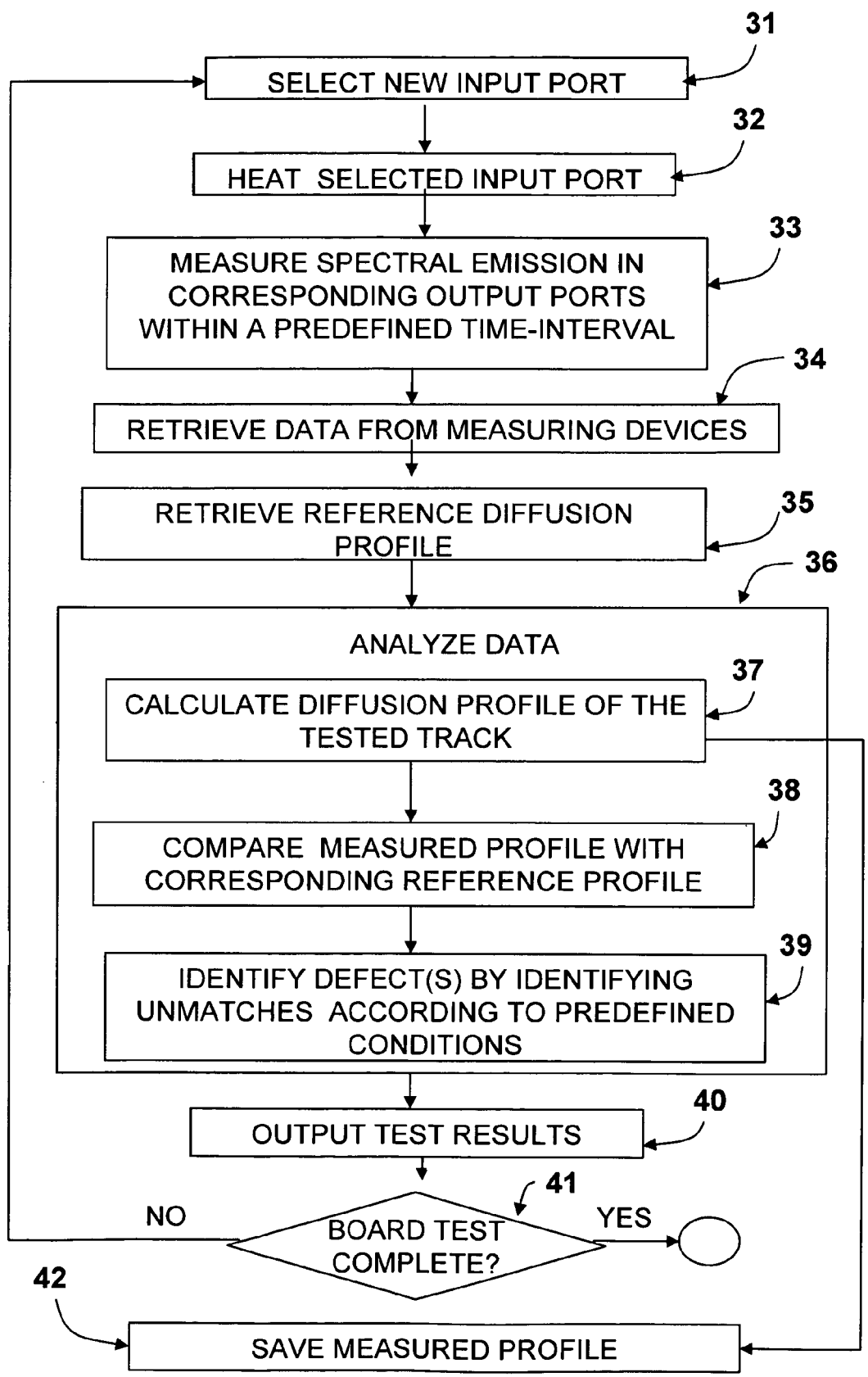
FIG. 3 is a flowchart, schematically illustrating a method for identifying defects in a PCB, by comparing the PCB's measured heat diffusion profile with a compatible theoretical or "ideal" profile, according to some embodiments of the invention.

FIG. 3 is a flowchart, schematically illustrating a method for identifying defects in a PCB electronic components assembly 100, by comparing the PCB's measured heat diffusion profile with a compatible theoretical or "ideal" profile, according to some embodiments of the invention;

According to these embodiments, the method may comprise:

Selecting a new input port 31, where the system 1000 enables automatic and/or manual selection of ports 11;

Heating selected input port 32 (e.g. by using the light source to heat the each selected port 11;

Measuring temperature (e.g. by measuring spectral emission) during a predefined time-interval "Δt" 33 (e.g. while heating or while cooling) in all the output ports 11 that correspond to the selected input port 11, using the measuring device(s) 300, meaning all output ports 11 that are the other end(s) of the track 12 of the selected input port 11;

Retrieving data from the measuring device(s) 34 (e.g. where the processing unit 400 retrieves that data from the measuring device(s) 300 including the measurements, the timing parameters, the track 12 identifier, the electronic components assembly 100 identifier and the like);

Retrieving a reference energy (heat) diffusion profile 35 (e.g., where the processing unit 400 retrieves the diffusion profile from the reference profiles database 420) that corresponds to the tested electronic components assembly's 100 design and to the specific track 12 under test;

Analyzing the data 36 to identify defects in the track 12 under test by, for example following the following steps: Calculating a measured energy (heat) diffusion profile of the track 12 under test 37; Comparing the measured diffusion profile with the retrieved reference profile 38; and Identifying defect(s) in the track 12 and/or ports 11 of the track 12 under test (e.g. by identifying mismatching parts in the compared profiles according to predefined conditions for determining an "un-match") 39; and Outputting the test results 40 (e.g. by notifying a user whether the PCB 100 is defected or not).

Steps 31-39 may be repeated 41 for each track 12 of the electronic components assembly 100 under test and for each electronic components assembly 100 tested.

According to some embodiments of the invention, the calculated measured energy (heat) diffusion profile of each track 12 associated with each electronic components assembly 100 may be saved 42 in the at least one results database 410 associated with the system 1000.

According to some embodiments of the invention, the reference profiles database 420 may be classified according to the design of each electronic components assembly 100 type specifying the profile of each track 12 on each electronic components assembly 100 to allow easy retrieval of the reference track profile that is correspondent to the track 12 that is being tested.

Figure 4:
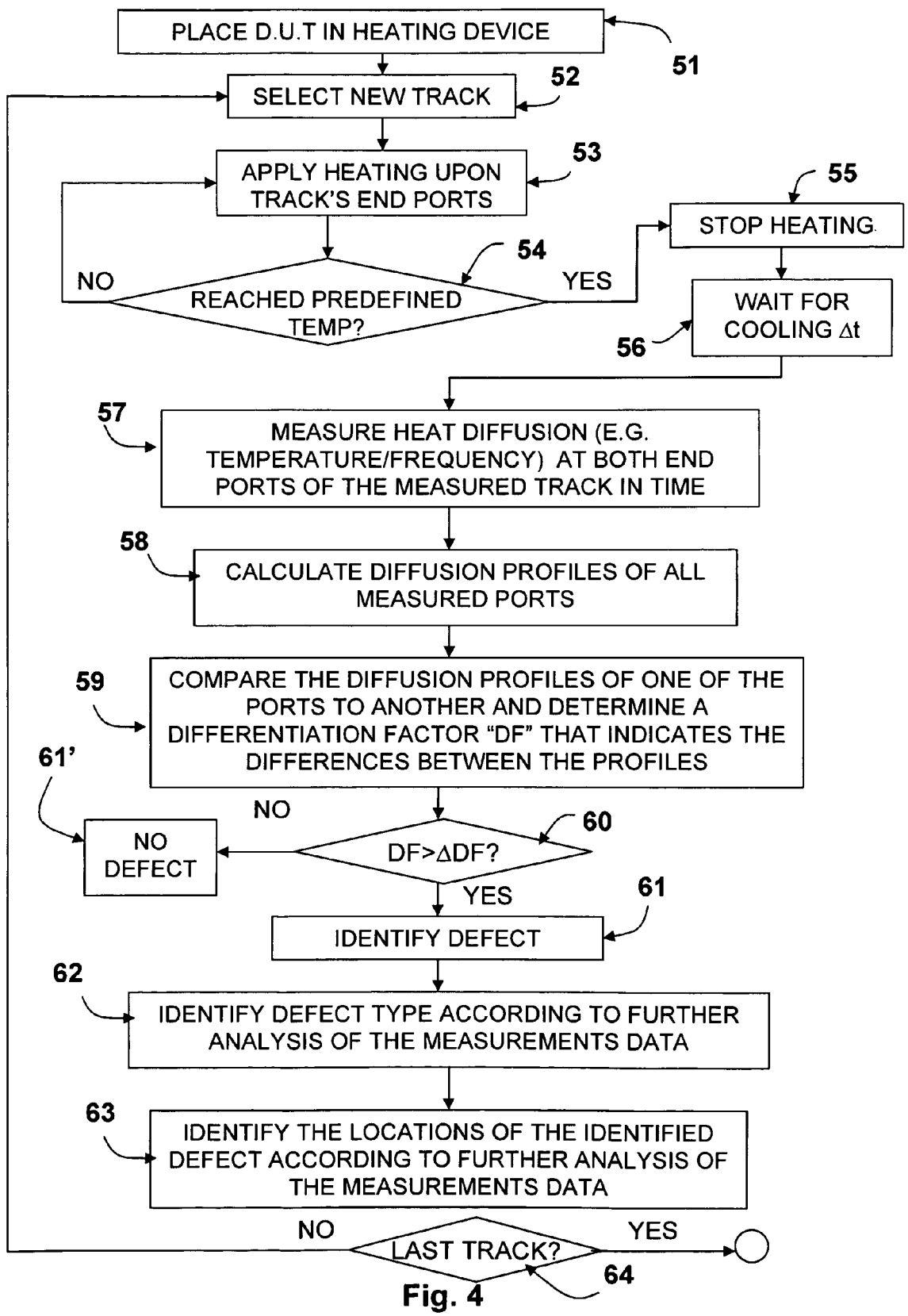
FIG. 4 is a is a flowchart, schematically illustrating a method for identifying defects in a PCB, by comparing the measured heat diffusion profile of the two sides of each track of a PCB under test, according to some embodiments of the invention.

FIG. 4 is a is a flowchart, schematically illustrating a method for identifying defects in a PCB electronic components assembly 100, by comparing the measured heat diffusion profile of at least two sides of each track 12 of the PCB assembly 100, according to some embodiments of the invention.

According to these embodiments, the method may comprise at least some of:

Placing the electronic components assembly 100 in the oven heating device 51;

Selecting at least one track 52;

Applying heat 53 at all (e.g. both) end ports 11 of the selected track 12;

Once the heating reaches a predefined temperature 54, the heating may be stopped 55 to allow the ports 11 and tracks 12 of the PCB 100 to cool down;

The measuring may be carried out while the system 1000 is cooling down (after the heating was stopped) throughout a predefined cooling time-interval "Δt1" 56;

Measuring heat diffusion (e.g. temperature/frequencies versus time) at all (e.g. both) end ports 11 of the selected track 12 within a predefined measuring time-interval "Δt1" 57;

Calculating the diffusion profiles of the measured ports 58 (e.g. the temperature versus time curve or the frequency versus time curve);

Comparing one of the calculated diffusion profiles of the track's 12 ports 11 with another calculated profile of the other port 11 to determine a differentiation factor "DF" that indicates the level of differences between the two ports 59;

If the DF 60 is smaller than a predefined DF threshold "ΔDF" than there is no defect identified 61', where if the DF is higher than the DF threshold ADF, than a defect is identified 61.

The defect type may be identified 62 according to analysis of the ports' 11 diffusion profiles' differences and behavior, using any mathematical and theoretical method for analyzing the profiles and their differences.

According to embodiments, the profiles analysis may further enable identifying the location of the defect 63.

The system 1000 may enable testing each of the assembly's 100 tracks 12 either simultaneously or one/group by one/group 64.

The identification of the defects may be classified according to defects types that can be identified by the system 1000 (e.g. gap defects, thickened parts of the track 12 etc.). The identification of the defects' 15 locations along the tracks 12 or at the ports 11 may be carried out according to location identification algorithms enabling to analyze the heat diffusion profile measured in order to locate the defect 15. The processing and display units 400 and 500 may enable displaying the identifying details of the defects 15 that were identified (e.g. the track 12 identifier, the location and type of the defect 15 etc.). According to embodiments of the invention, the identifying details of the defects 15 may be displayed graphically, textually, both or in any other way that is predefined in the system 1000.

FIGS. 5-8 may schematically illustrate several methods for identifying defects by heating a track 12 and/or its ports 11 and measuring the diffusion profile of each of its ports 11.

Figure 5:
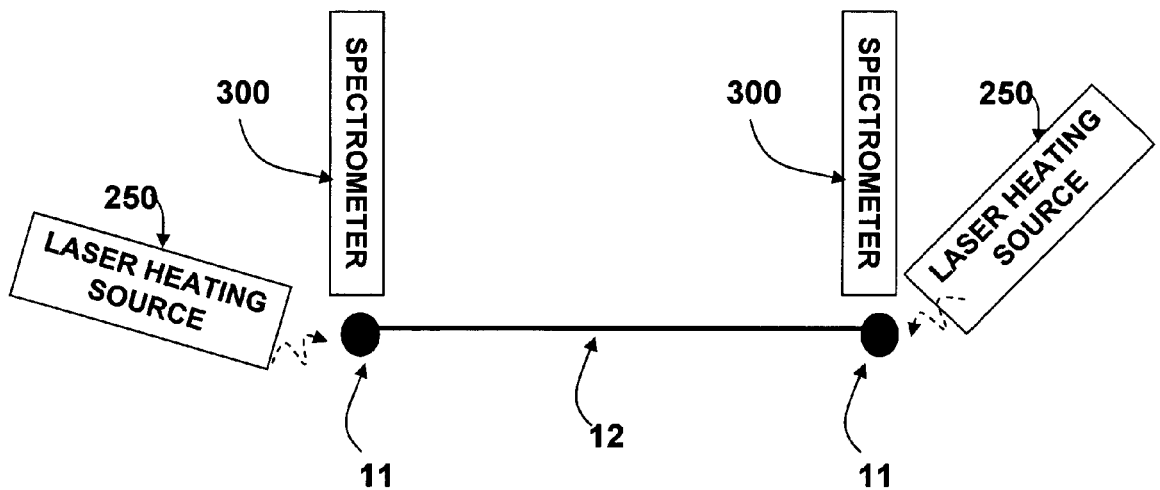
FIG. 5 schematically illustrates a single track having two ports, heated simultaneously at the two ports and simultaneously measured for heat diffusion at both ports, according to some embodiments of the invention.

FIG. 5 schematically illustrates a single track 12 having two ports 11, heated substantially simultaneously at the two ports 11 by laser heating sources 250 and simultaneously measured for heat diffusion at both ports 11 by spectrometers measuring devices 300, according to one embodiment of the invention.

Figure 6:
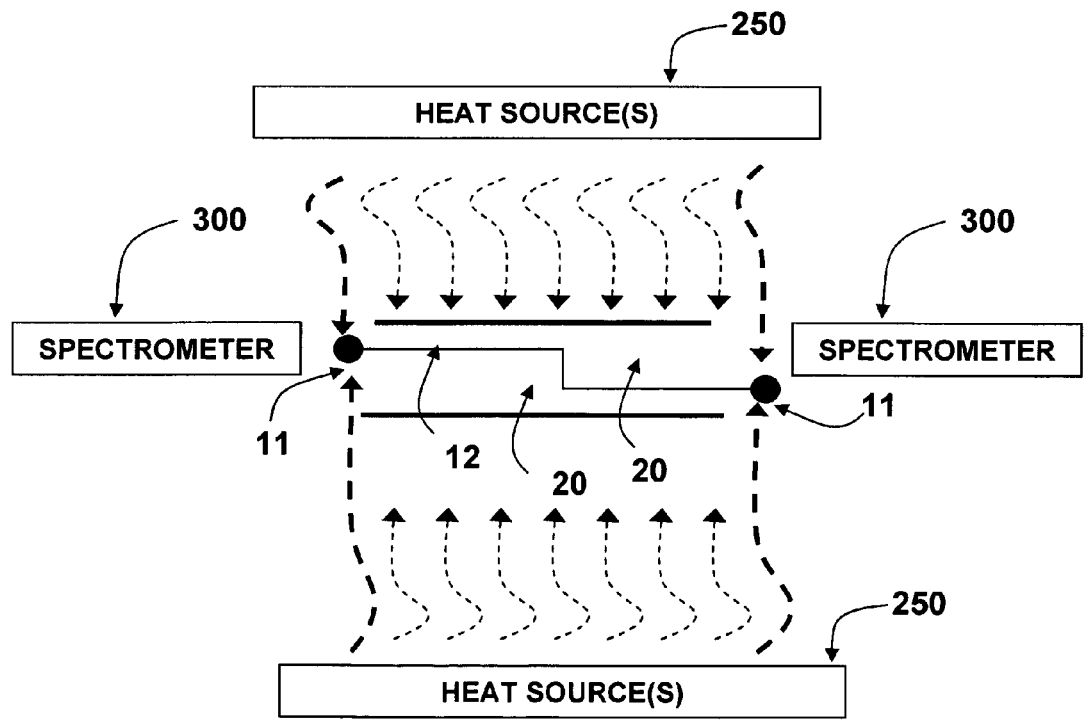
FIG. 6 schematically illustrates a single track having two ports, where the entire track is heated by heat sources that enable heating the entire track and lamina coating, and simultaneously measured for heat diffusion at both ports, according to some embodiments of the invention.

FIG. 6 schematically illustrates a single track 12 having two ports 11, where the entire track 12 and lamination 20' is heated by heat sources 250 that enables heating the entire track 12 and lamina coating 20 and simultaneously measured for heat diffusion, using spectrometers 300 at both ports 11, according to another embodiment of the invention.

Since a lamination material 20 in the illustration of FIG. 6 laminates the track 12, most of the heat is received and emitted through the ports 11. A defect along the track 12 may cause minor diffusion differences between the ports 11 enabling to detect defects.

Figure 7:
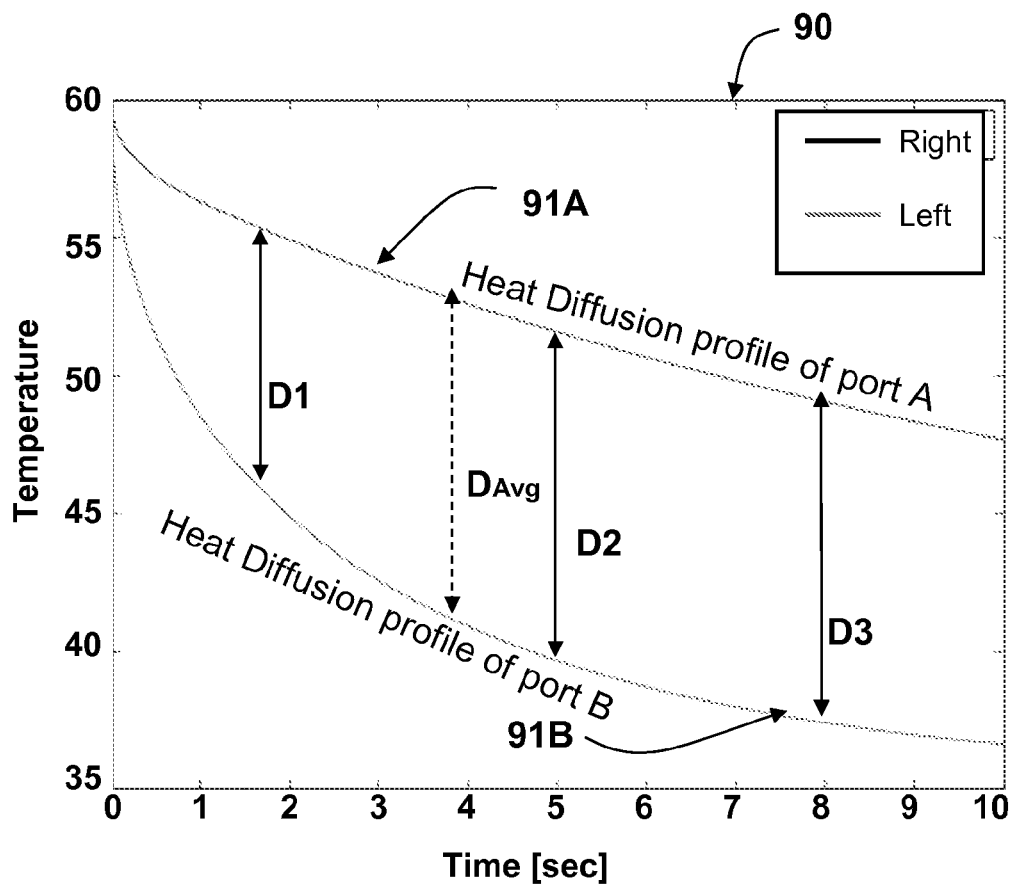
FIG. 7 is a theoretical simulation of heat diffusion profiles of two ports of the same track, where the profiles where simultaneously measured at the two ports of the tracks within a predefined time interval.

FIG. 7 is a theoretical simulation of heat diffusion profiles 91A and 91B of two ports 11 of the same track 12, where the profiles where simultaneously measured at the two ports 11 of the track 12 within a predefined time interval. The heat diffusion profiles in this example, represent the temperature measured at each of the ports 11, along the time axis. The differences between the profiles 91A and 91B may be calculated by calculating the distances "D1", "D2", and "D3" in temperature T between one profile 91A and another 91B at predefined time intervals "$\Delta t$", and calculating the average distance "$D_{Avg}$" as the differentiation factor (DF) between the ports 11. A DF that is higher than a predefined threshold $DF_{min}$ may be associated with a defect in the track 12.

According to other embodiments, instead of comparing the profiles of the ports 11 of the same track 12 to one another, a curve representing both ports 11 (the profile of the entire track 12) may be tested for its level of symmetry, in relation to the symmetry of the track 12 itself (e.g. shape or distance from the ports 11).

The level of symmetry of the measured energy diffusion profile of the track 12 may be compared with a reference symmetry parameter, where the reference symmetry parameter represents the level of symmetry of a reference track 12 that is corresponding to the tested track 12. A defect may be defined when the measured symmetry level deviates from the corresponding symmetry parameter in a deviation level that exceeds a predefined threshold.

According to embodiments, the heating may be carried out by emitting pulses of an optical light at a predefined frequency (or wavelength). The heating pulses may create phonon pulses of thermal energy (referred to herein as "thermal phonons") emitted from the ports 11 of a phonon frequency that is associated with (proportional to) the wavelength/frequency of the optical pulse. Frequency detectors 301, as illustrated in FIG. 8, specially designed to detect the phonon frequency/energy or changes thereof, may detect the phonon frequency.

Figure 8:
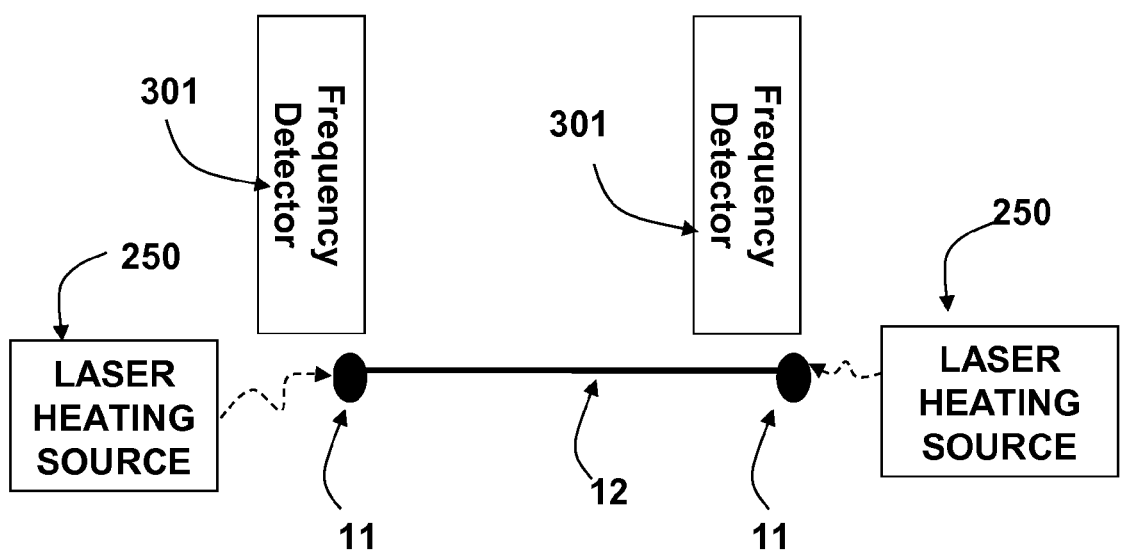
FIG. 8 schematically illustrates a single track having two ports, heated simultaneously at the two ports and simultaneously measured for diffusion frequency at both ports, according to some embodiments of the invention.

FIG. 8 schematically illustrates a single track 12 having two ports 12, heated simultaneously at the two ports 11 and simultaneously measured for the emitted phonon frequency/energy at both ports 11, according to another embodiment of the invention. Differences in the ports' 11 profiles may mean one or more measurement of the emitted phonon frequency (or an average frequency calculated of several frequency measurements) when the ports 11 are cooling/heated. The difference between the frequency (or proportionally the difference between the wavelengths) of measured at each port 11 may enable identifying defects in the track 12 (e.g. a difference of frequencies (wavelengths) that is higher than a threshold difference value "$\Delta f$".

While the above description contains many specifications, these should not be construed as limitations on the scope of the invention, but rather as exemplifications of the preferred embodiments. Those skilled in the art will envision other possible variations that are within its scope. Accordingly, the scope of the invention should be determined not by the embodiment illustrated, but by the appended claims and their legal equivalents.

What is claimed is:

1. A method of testing at least one electronic components assembly, each electronic components assembly comprising a multiplicity of tracks each connecting at least two ports, where each end of each track connects to at least one port, said method comprising:

applying heat upon at least one part of at least one of the tracks of the electronic components assembly under test, using at least one heating source;

measuring energy diffusion through said track within a predefined time interval, using at least one measuring device;

calculating at least one energy diffusion profile associated with the measured energy diffusion, where the profile represents the diffusion of energy versus time; and identifying defects in the at least one track, according to the analysis of the energy diffusion profile said calculation and identification are carried out by at least one processing unit.

2. The method of claim 1, wherein the measuring of energy diffusion is carried out while the electronic components assembly is cooling.

3. The method of claim 1, wherein the analysis further includes retrieving at least one reference diffusion profile, which corresponds to the tested track; and comparing the corresponding retrieved reference profile with the measured energy diffusion profile, wherein identifying of a defect in the tested track is carried out by identifying a substantial difference between the reference profile and the measured profile.

4. The method of claim 3, wherein each reference energy diffusion profile is associated with a specific design of a specific reference electronic components assembly, enabling to retrieve a reference energy diffusion profile that corresponds to the tested track and the tested type of electronic components assembly.

5. The method of claim 1, wherein at least two ports of each tested track are substantially simultaneously heated and substantially simultaneously measured for energy diffusion and wherein the analysis includes comparing the energy diffusion profile of one port in relation to the energy diffusion profile of the other profile of the same track.

6. The method of claim 5, wherein the energy diffusion profile of each track represents temperature versus time measurements of each port.

7. The method of claim 5, wherein the energy diffusion measuring is simultaneously carried out over a multiplicity of tracks.

8. The method of claim 1, wherein the measuring of energy diffusion is carried out when the at least one track and its ports are cooling.

9. The method of claim 1, wherein the measuring of energy diffusion is carried out when the at least one track and its ports are heated.

10. The method of claim 1, wherein the measuring includes simultaneously measuring the energy diffusion profiles in all ports of all the tracks of the electronic components assembly.

11. The method of claim 1, further comprising comparing the level of symmetry of the measured energy diffusion profile of each track with reference symmetry parameters, wherein the reference symmetry parameter of each track represents the level of symmetry of a reference track that is corresponding to each of the tested tracks, wherein a defect is defined when the measured symmetry level deviates from the corresponding symmetry parameter in a deviation level that exceeds a predefined threshold.

12. A method of testing at least one electronic components assembly, each electronic components assembly comprising a multiplicity of tracks each connecting at least two ports, where each end of each track connects to at least one port, said method comprising:

applying heat energy upon at least one of: at least one of the electronic components assembly's tracks; at least one port of that track, using at least one heating source;

measuring phonon frequency at each port of at least one of the assembly's tracks, using at least one measuring device; and identifying defects in the at least one track, by comparing the phonon frequency emitted from one port of the track to phonon frequency emitted from at least one other port of the track, said identification is carried out by at least one processing unit.

13. A system of testing at least one electronic components assembly, each electronic components assembly comprising a multiplicity of tracks connecting a multiplicity of ports, where each end of each track connects to at least one port, said testing system comprising:

at least one heating source, enabling to heat at least one part of at least one of the tracks of the electronic components assembly that is under test;

at least one measuring device, enabling to measure the energy diffusion through the at least one track within a predefined time interval; and at least one processing unit, enabling to control the heating and measuring devices, retrieve data from the measuring devices and heating sources and analyze the data, wherein the analysis enables identifying defects in tracks that are tested by analyzing of at least one energy diffusion profile of the track that is tested, which represents the diffusion of energy versus time.

14. The system of claim 13, further comprising at least one results database, operatively associated with the at least one processing unit, wherein the results database enables the processing unit to store and retrieve resulting measured energy diffusion profiles of tested tracks.

15. The system of claim 14, wherein a multiplicity of heating sources and measuring devices is installed in a single heating device enabling to simultaneously measure and heat predefined ports of at least some of the tracks of the electronic components assembly under test.

16. The system of claim 15, wherein the heating device enables simultaneously applying of heat to different input ports of the same electronic components assembly.

17. The system of claim 16, wherein the at least one measuring device is a spectrometer.

18. The system of claim 15, further comprising a display unit, operatively associated with the processing unit and an input unit also operatively associated with the processing unit, to enable displaying of measured and analyzed data, as well as to allow a tester to control measuring and heating features through the display and input units.

19. The system of claim 18, wherein the multiplicity of light sources enable simultaneously heating each port of at least one of the assembly's tracks, wherein the measuring devices enable simultaneously measuring energy diffusion of all ports of the at least one track, wherein the processing unit enables identifying defects in the tested at least one track by calculating energy diffusion profiles of all ports of the at least one track and comparing the energy diffusion profiles of one port of each track to at least one other port of the same track.

20. The system of claim 13, further comprising at least one reference profiles database, operatively associated with the at least one processing unit, enabling the processing unit to store and retrieve reference energy diffusion profiles of simulated ideal reference tracks compatible to the track that is under test, wherein the identification of defects in at least one tested track is carried out by comparing the energy diffusion profile of the tested track, measured by the measuring device, with a retrieved compatible reference energy diffusion profile, and wherein defects in the tested track are identified by identifying of differences between the measured energy diffusion profile and the reference energy diffusion profile.

21. The system of claim 13, wherein the at least one heating source is a light source enabling to heat specific input ports of tracks of tested electronic components assemblies, wherein controlling of the heating is enabled by controlling of the frequency of the emitted light.

22. The system of claim 13, wherein the at least one measuring device enables measuring the temperature of at least one of the ports of at least one of tracks under test along time.

* * * * *